(12) United States Patent
Franzen

(10) Patent No.: US 6,350,953 B1
(45) Date of Patent: Feb. 26, 2002

(54) METHOD FOR POTTING A POPULATED ASSEMBLY USING AN ANTI-VIBRATION POTTING COMPOUND, POPULATED ASSEMBLY AND CONTROLLER HAVING A POPULATED ASSEMBLY

(75) Inventor: Frank Franzen, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/606,592

(22) Filed: Jun. 29, 2000

(30) Foreign Application Priority Data

Jun. 29, 1999 (DE) ............................... 199 29 754

(51) Int. Cl.[7] ............................. H01L 23/28; H05K 5/06
(52) U.S. Cl. .................. 174/52.2; 174/52.4; 361/776; 257/788; 29/841
(58) Field of Search ........................... 174/52.2, 52.4; 361/776, 764; 257/787, 788; 29/841

(56) References Cited

U.S. PATENT DOCUMENTS

| 5,018,005 A | * | 5/1991 | Lin et al. .................... 257/730 |
| 5,452,182 A | * | 9/1995 | Eichelberger et al. ...... 361/749 |
| 5,615,088 A | * | 3/1997 | Mizumo ........................ 361/749 |

FOREIGN PATENT DOCUMENTS

| DE | 195 15 187 A1 | 11/1996 |
| DE | 44 07 810 C2 | 2/1998 |
| DE | 197 12 842 C1 | 8/1998 |

OTHER PUBLICATIONS

"Kapselung von Hybridschaltungen" (Schwarz), dated Jul./Aug. 1984, Elektronik Produktion & Prüftechnik, pp. 419–421, pertains to the encapsulation of hybrid circuits, as mentioned on p. 2 of the specification.

* cited by examiner

Primary Examiner—Dean A. Reichard
Assistant Examiner—Hung V Ngo
(74) Attorney, Agent, or Firm—Herbert L. Lerner; Laurence A. Greenberg; Werner H. Stemer

(57) ABSTRACT

A method for potting a populated assembly using an anti-vibration potting compound, a populated assembly and a controller having a populated assembly, include a circuit configuration potted by using an anti-vibration, thixotropic embedding compound. The circuit configuration includes a baseplate, an electrical circuit mounted thereon and having electrical components, and a flexible printed circuit board passing through to the circuit and making electrical contact with the circuit through lead wires. The components on one hand, and the contact points for the lead wires on the flexible printed circuit board on the other hand, are potted by using the embedding compound in separate process steps.

12 Claims, 3 Drawing Sheets

METHOD FOR POTTING A POPULATED ASSEMBLY USING AN ANTI-VIBRATION POTTING COMPOUND, POPULATED ASSEMBLY AND CONTROLLER HAVING A POPULATED ASSEMBLY

BACKGROUND OF THE INVENTION

Field of the Invention

The invention relates to a method for potting a populated or equipped assembly or module using an anti-vibration, thixotropic potting or embedding compound, a populated assembly potted according to the method and a controller having a populated assembly.

It is already known for populated assemblies to be potted by using an anti-vibration, thixotropic potting compound based on silicone (so-called Silgel). Silgel has a characteristic, which is referred to as thixotropic, of liquefying under the influence of a metering pressure used during the potting process, and of solidifying once again after emerging from the metering system. The potting process results in protection for electrical contacts, such as bonding wire connections or electrically conductive bonds in the populated assembly, against high vibration loads (of up to about 40 g) which occur, for example, in motor vehicles.

German Patent DE 197 12 842 C1, corresponding to U.S. application Ser. No. 09/407,255, filed Sep. 27, 1999, discloses a controller for a motor vehicle. That controller has an electrical circuit which is mounted on a baseplate and with which contact is made by a flexible printed circuit board that is routed to the circuit. The flexible printed circuit board is at the same time used as an electrical housing bushing.

An article entitled "Kapselung von Hybridschaltungen" [Encapsulation of Hybrid Circuits], by G. Schwarz, in Elektronik Produktion & Prüftechnik [Electronics Production & Test Technology], July/August 1984, pages 419 to 421 describes the use of epoxy resin for the encapsulation of hybrid circuits. In that case, either the entire hybrid circuit is sheathed with epoxy resin, or individual components in the circuit are potted separately.

German Published, Non-Prosecuted Patent Application DE 195 15 187 A1 describes a chip cover for completely or partially covering electrical, electronic or optoelectronic components on a chip. A particular feature of the chip cover is that the cover has a pigmentation agent added to it.

German Patent DE 44 07 810 C2 describes a circuit configuration in which silicone potting is used, that electrically insulates the circuit layout and mechanically protects it against destruction. In that case the potting compound is also used as a cushioning element to compensate for pressures in a version of the circuit configuration using pressure contacts.

SUMMARY OF THE INVENTION

It is accordingly an object of the invention to provide a method for potting a populated assembly using an anti-vibration potting compound, a populated assembly and a controller having a populated assembly, which overcome the hereinafore-mentioned disadvantages of the heretofore-known methods, assemblies and devices of this general type, in which the method permits an electrical circuit with which a flexible printed circuit board makes contact to be potted by using a thixotropic potting compound, in a cost-saving manner and with reliable processes and in which the populated assembly can be produced cost-effectively and is resistant to vibration.

With the foregoing and other objects in view there is provided, in accordance with the invention, a method for partial potting of a populated assembly, which comprises providing a baseplate; mounting a substrate on the baseplate; equipping the substrate with electrical components; guiding or positioning a flexible printed circuit board relative to the substrate; establishing electrical contact between the printed circuit board and the equipped substrate through lead wires mounted at corresponding contact points on the printed circuit board; enveloping the components disposed on the substrate with an anti-vibration, thixotropic potting compound; and enveloping the contact points of the lead wires on the printed circuit board with the anti-vibration, thixotropic potting compound, in a separate process step.

With the objects of the invention in view, there is also provided, a populated assembly, comprising a baseplate; a substrate mounted on the baseplate; electrical components mounted on the substrate; a flexible printed circuit board positioned or guided relative to the substrate, the printed circuit board having contact points; corresponding lead wires mounted at the contact points and establishing electrical contact between the printed circuit board and the substrate having the electrical components; a first potting structure applied over the substrate and formed of thixotropic potting compound; and a second potting structure applied over the contact points separately from the first potting structure, the second potting structure likewise formed of thixotropic potting compound.

Trials carried out for the purposes of the invention have shown that, with such a circuit layout, there are difficulties in causing anti-vibration potting using a thixotropic potting compound to be applied to the substrate and to the contact points of the conductor wires on the flexible printed circuit board in one process step. If the potting compound is applied to the substrate with a relatively high thixotropic level, that has to be done by using a high metering pressure, so that the potting compound assumes a sufficiently low viscosity during the metering process, in order to allow it to reach both the electrical components and the contact points. The high metering pressure may damage bonding wire connections. Furthermore, due to the high thixotropic level, it is possible for difficulties to occur in which the potting compound solidifies too rapidly so that the bonding wire connections are then not completely sheathed, thus resulting in inadequate vibration protection. If a potting compound having a relatively low thixotropic level is used, it is admittedly possible to avoid the problems mentioned above, but the potting compound, which is a relatively thin liquid in that case, flows to a pronounced extent on the flexible printed circuit board. The flowing results in a large amount of potting compound being required. If the flexible printed circuit board is used as a housing bushing, it is furthermore a disadvantage that a housing having a large base area is required in order to prevent the potting compound from spreading into the seal region, where it may cause leaks later. Furthermore, for process reliability reasons, a comparatively large base-area tolerance range must also be provided for the potting compound to run over, since it has been found that the potting compound (for example thixotropic Silgel) as supplied by the manufacturer has considerable viscosity variations. Overall, it has been found that metering of the thixotropic potting compound using a sufficiently reliable process can only be achieved, within one process step, if at all, by taking highly costly additional measures (for example by adding barriers to prevent the potting compound from running) and/or by accepting large housing dimensions.

Those difficulties are overcome by the process according to the invention of potting the assembly in (at least) two process steps. A comparatively small amount of thixotropic potting compound is required. It is furthermore advantageous that considerably less space (that is to say baseplate area) need be provided for the potting compound to flow over, since the flow region is considerably reduced in size as the surface tension has a more pronounced effect when the amount of potting compound is reduced. This effect is particularly evident when potting the contact points.

In principle, the two process steps may be carried out by using potting compounds with different thixotropy levels. However, in accordance with another mode of the invention, the same potting compound with the same thixotropy level is preferably used for potting the electrical components and for potting the contact points since, in this case, the overall process can be carried out more cost effectively by using only one potting system.

In accordance with a first mode of the invention, the substrate, with the electrical components mounted thereon, is potted over the entire surface. This results in the maximum process speed.

In accordance with a second mode of the invention, at least some of the electrical components mounted on the substrate are provided with individual potting. The advantage thereof is that this requires even less potting compound than the first variant, which minimizes the material costs.

In accordance with a further mode of the invention, particularly with the first mode, it is preferable for the substrate to be disposed in a depression zone in the baseplate, or for the baseplate to have a trench structure surrounding the substrate. In both cases, potting compound going beyond the edge of the substrate can be caught in the depression zone or the trench structure.

In accordance with an added mode of the invention, with regard to the second process step which is associated with the potting of the contact points, individual contact points may be potted either individually or else jointly.

With the objects of the invention in view, there is additionally provided a controller for installation in a motor vehicle transmission or in a motor vehicle engine, comprising the populated assembly.

Other features which are considered as characteristic for the invention are set forth in the appended claims.

Although the invention is illustrated and described herein as embodied in a method for potting a populated assembly using an anti-vibration potting compound, a populated assembly and a controller having a populated assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
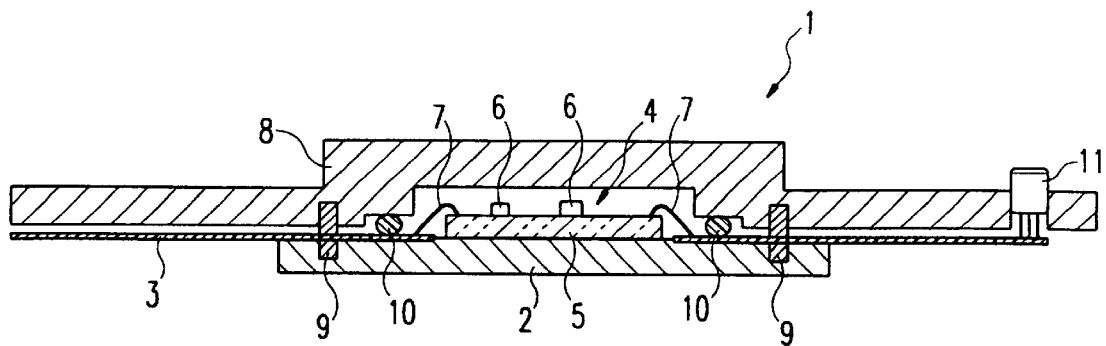
FIG. 1 is a diagrammatic, sectional view of a transmission controller having a circuit layout according to the invention, which is intended for installation in a transmission.

Referring now to the figures of the drawings in detail and first, particularly, to FIG. 1 thereof, there is seen a transmission controller 1 for installation in a transmission. A flexible printed circuit or printed circuit board 3 is bonded (laminated) in an oil-tight manner, by using an oil-resistant adhesive, onto a metallic baseplate 2 which is preferably composed of aluminum. The flexible printed circuit board 3 surrounds an electrical circuit 4 on all sides. The electrical circuit 4 includes, for example, a ceramic printed circuit substrate 5 (LTCC substrate) and electrical components 6 mounted thereon. The ceramic substrate 5 is bonded onto the baseplate 2, in a central region of the latter, by using a thermally conductive adhesive. Electrical contact between the electrical circuit 4 and the flexible printed circuit board 3 is made through lead wires 7, preferably in the form of aluminum thick-wire bonds (the thickness of the lead wires 7 is approximately 300 $\mu$m).

A housing cover 8 is coupled, in an oil-tight manner using a ring seal 10, to the metallic baseplate 2, through the use of a contact-pressure connection provided by attachment elements 9. The flexible printed circuit board 3 passes out of the interior of the controller housing 2, 8 between the ring seal 10 and the metallic baseplate 2 and makes contact with electrical components, for example a temperature sensor 11, disposed outside the controller housing 2, 8.

FIGS. 2 to 7 are used to explain a potting (not shown in FIG. 1) of the electrical components 6 and of contact points 14 between the lead wires 7 and the flexible printed circuit board 3 using a thixotropic embedding compound 15. It has been found that potting of the components 6 on the substrate 5 is required at least whenever the components 6 are made contact with by contact bonding, laser welding or soldering on the substrate 5.

The thixotropic embedding compound 15 used for the purposes of the invention is preferably thixotropic Silgel. Thixotropic Silgel is a gel with a high proportion of silicone, which has an agent having a thixotropic effect added to it in order to achieve sufficient stability. Immediately after emerging from a metering opening of a metering system, the Silgel has a viscosity comparable approximately to that of a liquid. In the mechanically unloaded state, the Silgel solidifies to a viscosity comparable to that of honey and is then able to form the potting structures described in the following text and illustrated in the drawings. Nonthixotropic Silgel (which likewise has slightly thixotropic characteristics) is virtually a liquid and thus flows too thinly for the purposes of the invention.

Figure 2:
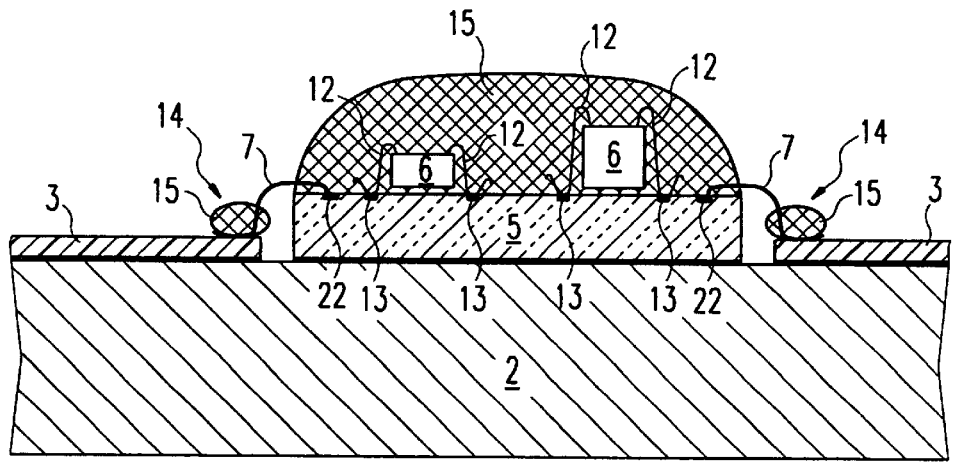
FIG. 2 is a fragmentary, sectional view of a first embodiment variant of the invention.

According to FIG. 2, the entire upper surface of the substrate 5, together with all of the electrical components 6 located thereon, is potted in a first process step. This results in a domed potting structure (shown exaggerated in FIG. 2). In the process, electrical bonding wire connections 12 are completely sheathed by the embedding compound 15. The connections 12 are so-called thin-wire bonds which have a thickness, for example, of 30 μm, are preferably formed of gold and run between the electrical components 6 and contact pads 13 on conductor tracks integrated in the ceramic substrate 5. Mating contact points 22 between the lead wires 7 and the integrated conductor tracks can also be sheathed by the embedding compound 15 in this case.

In a second process step, the lead wires 7 are likewise potted with thixotropic Silgel at their contact points 14 on the flexible printed circuit board 3. The potting process may be carried out locally, that is to say individually for each contact point 14. Alternatively, a plurality of adjacent contact points 14 can be coated with one cohesive strand 16 of embedding compound 15 seen in FIG. 7.

Figure 3:
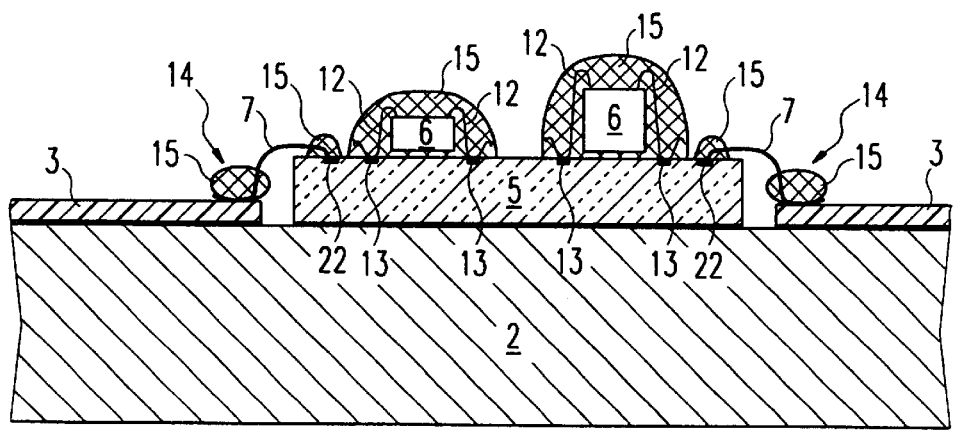
FIG. 3 is a fragmentary, sectional view of a second embodiment variant of the invention.

FIG. 3 shows a second embodiment variant, in which the electrical components 6 on the ceramic substrate 5 are potted individually in the first process step. Once again, the thin-wire bonding wire connections 12 of the electrical components 6 are completely sheathed by the embedding compound 15.

The second process step (potting the contact points 14 on the flexible printed circuit board 3) is carried out in the manner already explained with reference to FIG. 2. In a further potting step, the lead wires 7 on the mating contact points 22 on the substrate side are sheathed with embedding compound.

In both embodiment variants, the two process steps may be carried out in any order. However, it is important for the embedding compounds 15 to be applied in separate metering sequences over the ceramic substrate 5 and over the contact points 14. Normally, one metering system having a single metering opening is used, and the metering opening is moved relative to the circuit layout of the transmission controller 1 by using an automatic positioning system with optical position monitoring.

Figure 4:
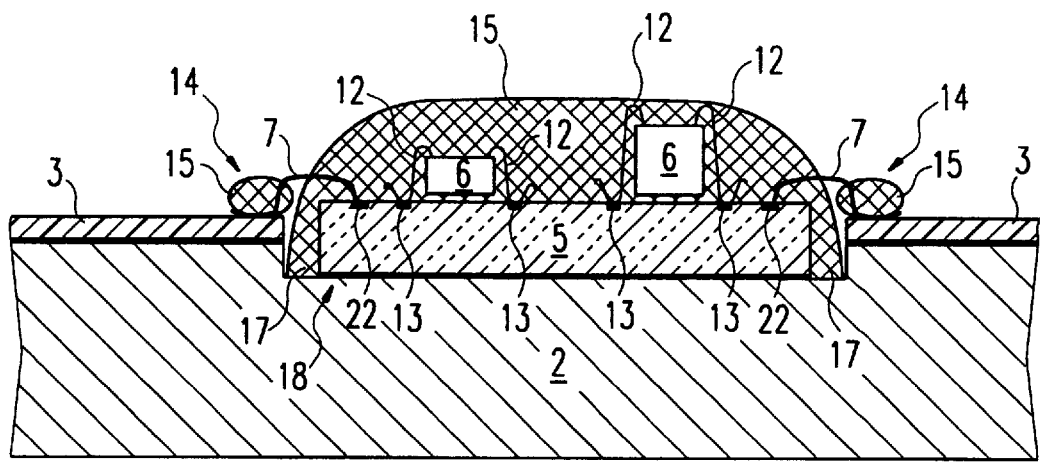
FIG. 4 is a fragmentary, sectional view of the first embodiment variant having a depression zone in a baseplate.

According to FIG. 4, the ceramic substrate 5 may be inserted in a depression zone 18 in the baseplate 2. The depression zone 18 has larger lateral dimensions than the ceramic substrate 5, so that a circumferential gap region 17 remains around the periphery of the ceramic substrate 5. It is possible to catch any embedding compound 15 which may go beyond the substrate edge in the circumferential gap region 17. This has an advantageous effect on the process reliability of the first process step since viscosity variations of the embedding compound resulting from its production are compensated for by catching it in the circumferential gap region 17.

Figure 5:
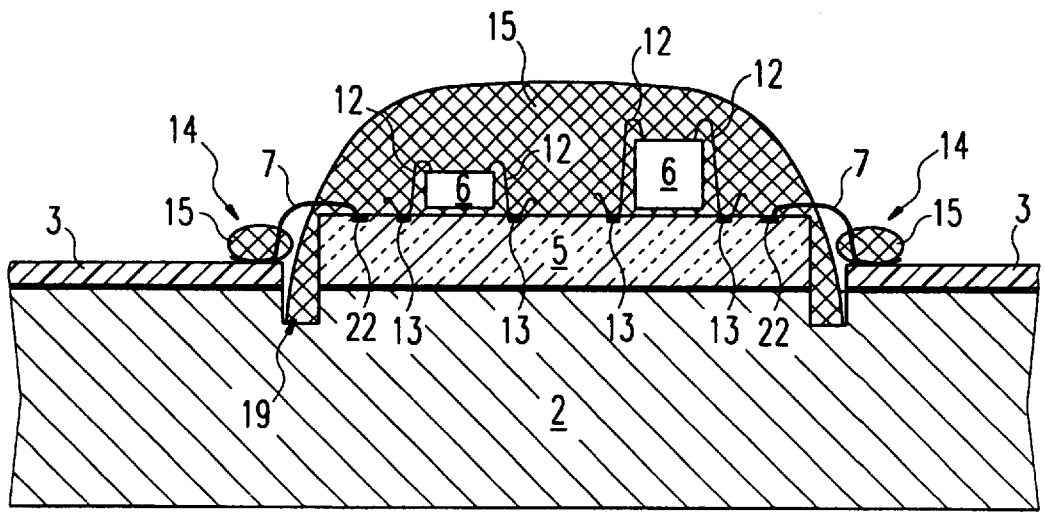
FIG. 5 is a fragmentary, sectional view of the first embodiment variant having a trench structure in the baseplate.

According to FIG. 5, the same aim can be achieved by a trench structure 19 circumscribing the ceramic substrate 5.

Figure 6:
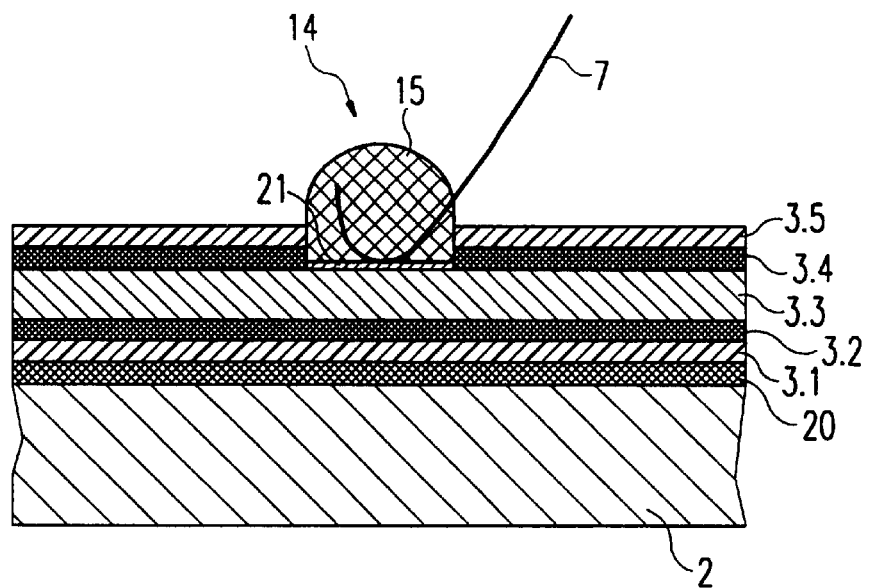
FIG. 6 is a fragmentary, sectional view of a flexible printed circuit board in the region of a contact point.

FIG. 6 shows the structure of the flexible printed circuit board 3 in the region of a contact point 14. The flexible printed circuit board 3 is laminated on the baseplate 2 by using an oil-resistant adhesive 20 and includes two plastic films 3.1 and 3.5, between which an electrical conductor track 3.3 is embedded, using adhesive layers 3.2 and 3.4.

The plastic film 3.5 on the covered side and the adhesive layer 3.4 are cut out in the region of the contact point 14. The electrical conductor track 3.3 is provided in this region with a contact metal coating 21 (for example 2–4 μm of nickel with 0.2–0.4 μm of gold above it). The lead wire 7 is bonded to the contact metal coating 21.

The amount of embedding compound 15 to be applied during the metering process must be controlled so as to achieve a minimum required potting height of approximately 400 μm above the contact metal coating 21. The amount can be kept small since the embedding compound 15 forms a hemispherical droplet (or an essentially hemispherical strand cross section when formed as a strand seen in FIG. 7) due to surface tension. This effect is assisted by the fact that the contact metal coating 21 is depressed with respect to the surface of the flexible printed circuit board 3 (the distance between the contact metal coating 21 and the printed circuit board surface may, for example, be approximately 50 μm). FIG. 6 makes it clear that virtually no flowing of the embedding compound 15 takes place in the region of the contact point 14. This is so even if the same (relatively slightly thixotropic) Silgel is used in the second process step for the embedding compound 15 as in the first process step.

Figure 7:
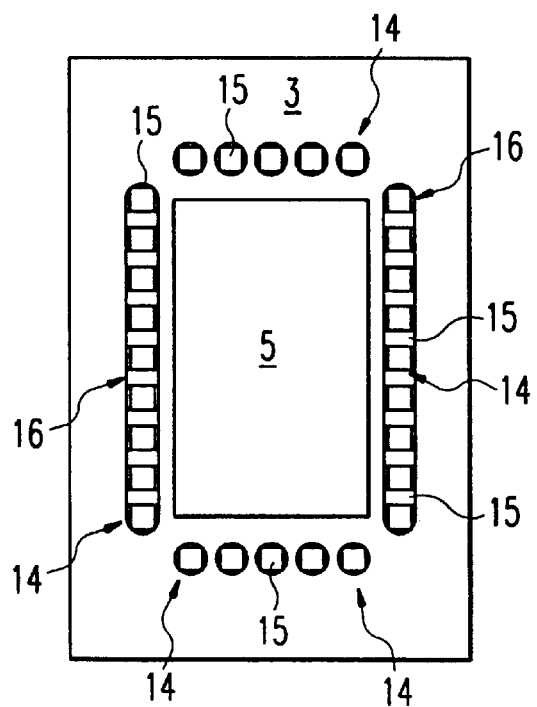
FIG. 7 is a plan view of a circuit layout according to the invention with contact points potted individually and jointly.

FIG. 7 shows a diagrammatic plan view of the flexible printed circuit board 3 with a ceramic substrate 5 (its components and potting are not shown). The contact points 14 may, as already explained, be potted either individually or jointly through the use of one strand 16 of embedding compound 15, in the second process step.

I claim:

1. A method for partial potting of a populated assembly, which comprises:
    providing a baseplate;
    mounting a substrate on the baseplate;
    equipping the substrate with electrical components;
    positioning a flexible printed circuit board relative to the substrate;
    establishing electrical contact between the printed circuit board and the equipped substrate through lead wires mounted at corresponding contact points on the printed circuit board;
    enveloping the components disposed on the substrate with an anti-vibration, thixotropic potting compound; and
    enveloping the contact points of the lead wires on the printed circuit board with the anti-vibration, thixotropic potting compound, in a separate process step.

2. The method according to claim 1, which further comprises using the same potting compound with the same thixotropy level for potting the electrical components and for potting the contact points.

3. The method according to claim 1, which further comprises full-surface coating the substrate equipped with the electrical components.

4. The method according to claim 1, which further comprises individually potting at least some of the electrical components mounted on the substrate.

5. The method according to claim 1, which further comprises individually potting individual contact points.

6. The method according to claim 1, which further comprises jointly potting a plurality of the contact points.

7. The method according to claim 1, which further comprises selecting the thixotropic potting compound as a silicone-based gel mixed with an agent having a thixotropic effect.

8. The method according to claim 1, which further comprises selecting the thixotropic potting compound as a Silgel which has been made thixotropic.

9. A populated assembly, comprising:
    a baseplate;
    a substrate mounted on said baseplate;
    electrical components mounted on said substrate;
    a flexible printed circuit board positioned relative to said substrate, said printed circuit board having contact points;
    lead wires mounted at said contact points and establishing electrical contact between said printed circuit board and said substrate having said electrical components;

a first potting structure applied over said substrate and formed of thixotropic potting compound; and a second potting structure applied over said contact points separately from said first potting structure, said second potting structure likewise formed of thixotropic potting compound.

10. The populated assembly according to claim 9, wherein said baseplate has a depression zone formed therein in which said substrate is disposed.

11. The populated assembly according to claim 9, wherein said baseplate has a trench structure surrounding said substrate.

12. A controller for installation in a motor vehicle transmission or engine, comprising a populated assembly including:

a baseplate;

a substrate mounted on said baseplate;

electrical components mounted on said substrate;

a flexible printed circuit board positioned relative to said substrate, said printed circuit board having contact points;

lead wires mounted at said contact points and establishing electrical contact between said printed circuit board and said substrate having said electrical components;

a first potting structure applied over said substrate and formed of thixotropic potting compound; and a second potting structure applied over said contact points separately from said first potting structure, said second potting structure likewise formed of thixotropic potting compound.

* * * * *